United States Patent [19]

Masatoshi

[11] Patent Number: 5,028,970
[45] Date of Patent: Jul. 2, 1991

[54] IMAGE SENSOR

[75] Inventor: Tabei Masatoshi, Kanagawa, Japan

[73] Assignee: Fuji Photo Film Co., Ltd., Tokyo, Japan

[21] Appl. No.: 614,556

[22] Filed: Nov. 9, 1990

Related U.S. Application Data

[63] Continuation of Ser. No. 257,662, Oct. 14, 1988, abandoned.

[30] Foreign Application Priority Data

Oct. 14, 1987 [JP] Japan .................................. 62-257395
Feb. 24, 1988 [JP] Japan .................................. 63-39694

[51] Int. Cl.$^5$ .................................................. H01L 27/14
[52] U.S. Cl. ........................................ 357/30; 357/24; 357/32; 357/55
[58] Field of Search ........................ 357/30, 24, 32, 55

[56] References Cited

U.S. PATENT DOCUMENTS 4,654,536 3/1987 Saito et al. ............................ 357/30
4,774,586 9/1988 Koike et al. ........................... 357/30

Primary Examiner—Edward J. Wojciechowicz
Attorney, Agent, or Firm—Sughrue, Mion, Zinn Macpeak & Seas

[57] ABSTRACT

An image sensor for sequentially reading signals from photoelectric converting elements disposed in a matrix and formed on a substrate in which both an image sensor and a photometry sensor are incorporated on the same substrate. The sensor includes a light-shielding layer disposed over the area of the substrate except the area of the photoelectric elements, the light-shielding layer forming a lower electrode. A pn-junction photodiode layer is disposed over the light-shielding layer, and an upper transparent electrode layer is disposed at least over the photodiode layer. The upper transparent electrode layer is divided into a plurality of pattern areas. If desired, at least one of the pattern areas of the upper transparent electrode layer may be further divided into a plurality of very small areas and color filters formed over the very small areas.

7 Claims, 3 Drawing Sheets

IMAGE SENSOR

This is a continuation of application Ser. No. 07/257,662, filed Oct. 14, 1988, now abandoned.

BACKGROUND OF THE INVENTION

The present invention relates to an image sensor having a photometric function for sensing the intensity of incident light added to the functions of a conventional image sensor. The invention further relates to an image sensor enabling multi-pattern photometry to be carried out therewith.

Photometry is carried out before taking a photograph to determine various photographing factors such as exposure, white balance, etc., in an electronic photographing apparatus such as an electronic still camera, electronic video camera, or the like, similarly to an ordinary film-type camera. For this purpose, in a conventional electronic camera, separately from a photographing sensor, a special photodiode is provided on a lens in the front side of the camera or inside the camera body behind the photographing lens.

Various methods of carrying out photometry are known, including a center-emphasis system in which the subject is placed in the center portion of the scene and an edge-portion-emphasis system in which the subject is placed in an edge portion of the scene. In an ordinary film camera, furthermore, there is known a so-called multi-pattern photometry system in which the scene is divided into a plurality of pattern areas which are suitably selectively used as objective areas for photometry according to the composition of the picture.

However, it has not heretofore been possible to provide a photometry sensor on the same chip as the photographing sensor without lowering the aperture ratio of the photographing sensor. Furthermore, in order to employ the multi-pattern photometry system in an electronic photographing apparatus such as an electronic still camera, it is necessary to either add a special device to the photometry image sensor such as a photodiode as mentioned above, provide a plurality of photometry image sensors, or distribute the incoming light through a complicated optical system. All of these techniques are, however, unsuitable if the camera is to be miniaturized because of the provision of the separate photometry sensor.

SUMMARY OF THE INVENTION

The present invention has been attained in view of the circumstances described above, and an object thereof is to provide an image sensor in which a photometry sensor is incorporated on the same chip as a photographing sensor, and the photometry sensor is employed to enable multi-pattern photometry to be carried out, and thus making it possible to improve photographing functions such as special photographing and to miniaturize the camera.

Specifically, the above and other objects of the present invention are attained by an image sensor for sequentially reading signals for photoelectric converting elements disposed in a matrix in which the image sensor comprises a light-shielding layer disposed over the surface of a substrate except the area of the photoelectric elements with the light-shielding layer acting as a lower electrode, a pn-junction photodiode layer disposed over the light-shielding layer, and an upper transparent electrode layer disposed at least over the photodiode layer.

Electrodes are led out from the respective pattern areas so that it is made possible to arbitrarily extract a photoelectric current signal generated in a desired area to thereby realize multi-pattern photometry.

A further object of the present invention is to provide an image sensor in which a photometry sensor is incorporated on the same chip as a photographing sensor, and the photometry sensor is arranged in such a manner as to make it possible to carry out multi-pattern photometry and to obtain a detection signal for automatic white balance so that multi-function outputs can be obtained arbitrarily with a single sensor.

More specifically, the above object of the present invention can be attained by an image sensor for sequentially reading signals from photoelectric converting elements disposed in a matrix in which a light-shielding layer is disposed over the surface of a substrate except the area of the photoelectric elements with the light-shielding layer acting as a lower electrode, a pn-junction photodiode layer disposed over the light-shielding layer, and an upper transparent electrode layer disposed at least over the photodiode layer and divided into a plurality of pattern areas, wherein at least one of the pattern areas of the upper transparent electrode layer is further divided into a plurality of very small areas and color filters are formed over the very small areas so that outputs corresponding to color filters in the same color can be extracted independently of the outputs corresponding to the other color filters.

Respective electrodes are led out from the plurality of pattern areas. Moreover, R, G and B color signals are extracted from the plurality of very small areas for the respective colors independently of each other. As a result, multi-pattern photometry and color temperature detection can be performed.

DESCRIPTION OF THE PREFERRED EMBODIMENTS

Preferred embodiments of the present invention will be described in detail with reference to the drawings.

Although the present invention is applicable to any type of image sensor, an interline transfer CCD will be described by way of example.

Figure 3:
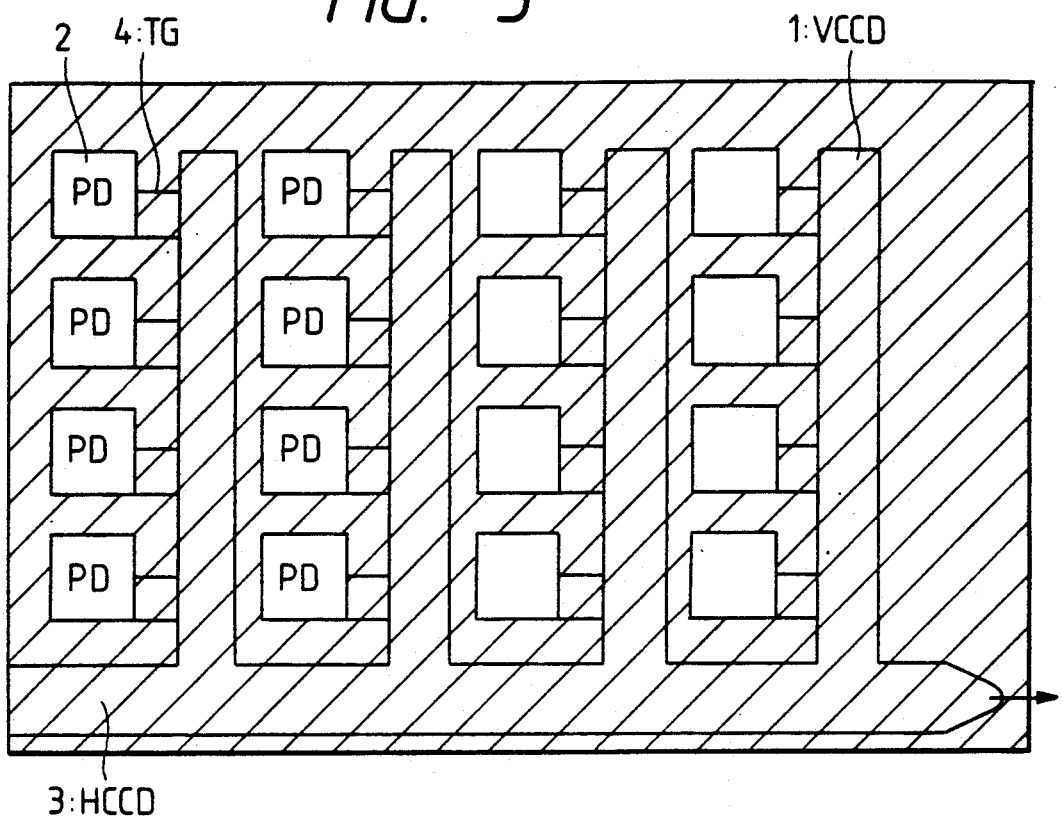
FIG. 3 is a diagram showing the arrangement of an image sensor according to the present invention.

FIG. 3 shows plan view of a conventional interline transfer CCD for the sake of explanation of the invention.

Each of vertical CCDs 1 is disposed between adjacent arrays of light-detecting portions 2 (for example, photodiodes). The vertical CCDs 1 are connected at their lower portions to a horizontal, reading CCD 3. Areas except the light-detecting portions 2 are covered with a light-shielding layer (shown hatched in the drawings) through a thin isolation layer 12 (FIG. 4) formed, for example, of $SiO_2$ or PSG. Signal charges generated in the light-detecting portions 2 are transferred simultaneously through transfer gates 4 to the vertical CCDs 1 during the vertical blanking period, transferred downward in the vertical CCDs 1, supplied to the horizontal CCD 3 from output terminals of the respective vertical CCDs 1 line by line, and read out sequentially.

Figure 4:
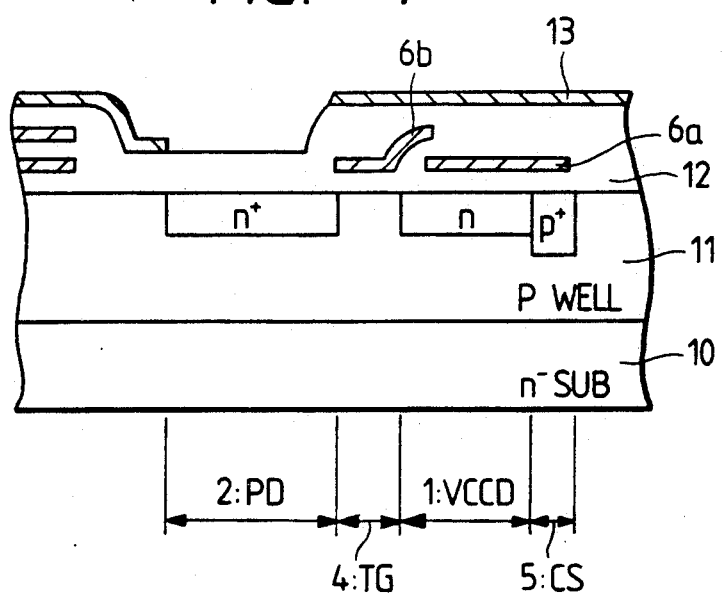
FIG. 4 is a horizontal sectional view of a cell of a conventional sensor.

FIG. 4 shows a horizontal sectional view of a single cell in FIG. 3, in which an $n^+$ region corresponding to the photodiode 2, an n region corresponding to the vertical CCD 1, and a $p^+$ region corresponding to a channel stop 5 are formed by impurity-ion implantation in the surface of an $n^-$ type semiconductor substrate 10 through a P-type well layer 11. Further, two polysilicon transfer electrode layers 6a and 6b forming the vertical CCD 1 are disposed through the isolation layer 12, which is made of silicon oxide film. The entire area including the above-mentioned transfer electrodes 6 is covered with the isolation layer 12 on which a light-shielding layer 13 is provided over the area except at for the light-detecting portion 2.

Figure 1:
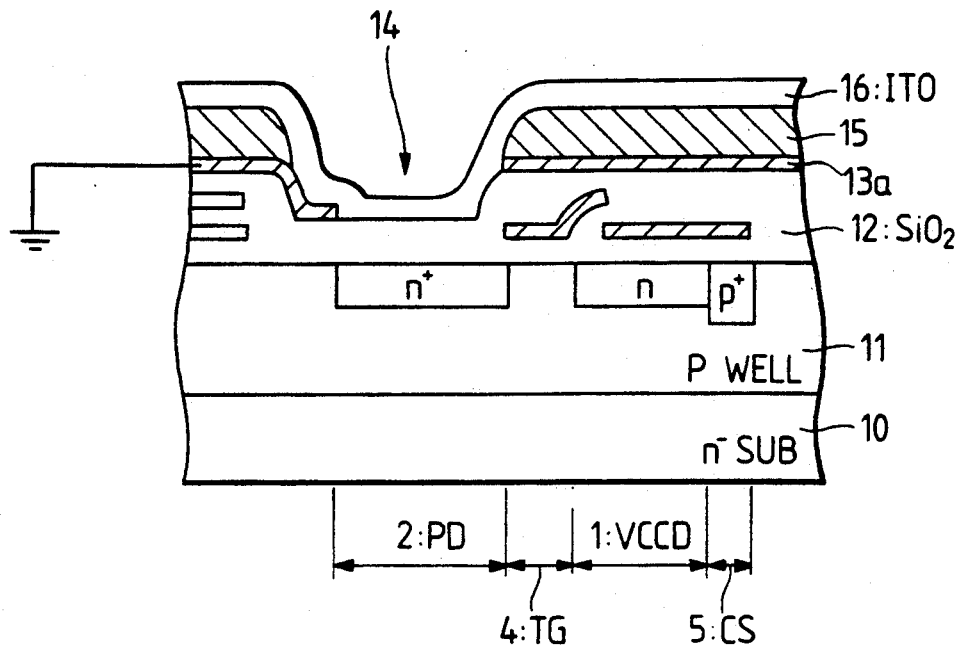
FIG. 1 is a horizontal sectional view of a cell of an image sensor constructed according to a preferred embodiment of the present invention.

The image sensor according to the present invention can be modified as shown in FIG. 1. The same elements as those in FIG. 4 are represented by the same reference numerals and a further description thereof will be omitted.

Figure 2:
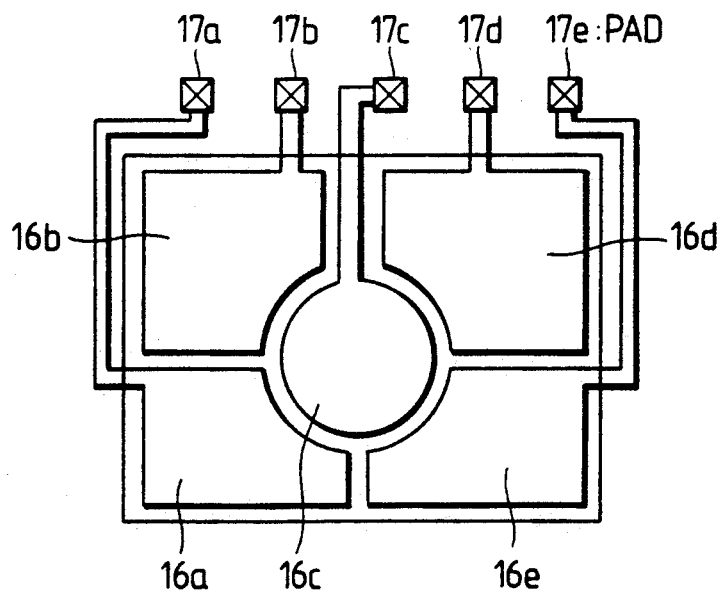
FIG. 2 is a plan view illustrating the pattern shape of an upper transparent electrode layer of the sensor in FIG. 1.

The light shielding layer 13 in this embodiment is formed by a conductive material (for example, an aluminum film) so as to be used as a lower electrode 13a, which is grounded. A thin-film photodiode layer 15 is further disposed over the area of the lower electrode 13a except an incident-light opening portion 14 on the semiconductor substrate. The thin film photodiode layer 15 can be formed of a a-Si pn junction, a GaAs pn junction, a GaP pn junction, or the like. Further, an upper electrode layer 16, made of a transparent conductive material such as ITO, is provided over the entire area of the substrate including the thin film photodiode layer 15 and the light-detecting portion 2. Alternatively, the transparent conductive layer may be provided at least over the thin film photodiode layer 15. The transparent electrode layer 16 is divided into a plurality of areas, for example, 16a, 16b, 16c, 16d and 16e, through pads 17a, 17b, 17c, 17d, and 17e, as shown in FIG. 2.

In the thus-arranged image sensor, while photoelectric conversion for photographing is performed by the light-detecting portions 2 provided in the same manner as in the prior art, light incident to the area except the light-detecting portions 2 is photoelectrically converted by and extracted from a photometry sensor (constituted by the elements 13a, 15 and 16 in FIG. 1) provided over the area except the light-detecting portions 2. The upper transparent electrode layer 16 is patterned into a plurality of areas, and a signal required for photometry is extracted selectively from the patterned areas.

Further, in order to obtain a white balance adjustment signal, it is necessary, for example, to extract signals for three primary colors RGB. To this end, each area shown in FIG. 2 is further divided for colors, for example, in a comb-like pattern, so that signals of the respective colors can be extracted independently of each other to thereby obtain a white balance signal.

Although an interline CCD has been described by way of example, it is understood that the present invention is not limited to such embodiments and is applicable to any type of CCD, for example, a frame transfer CCD, a MOS-type CCD, and the like.

As has been described above, in the image sensor according to the present invention, in addition to a light-detecting portion used for sensing an image signal, a photometry sensor is provided in an area not used for light detection on the same chip of the light-detecting portion, whereby photometry can be performed with no adverse effect on photographing operation in the electronic still camera or the like in which the sensor is applied. Further, in the case where the photometry sensor is divided into a plurality of areas, multi-pattern photometry can be performed. Moreover, photometry with high accuracy and miniaturization of the photographing apparatus can be attained since the photometry sensor is incorporated within the same chip.

Further, it is possible to reduce influences such as flare due to unwanted reflection from nonphotosensitive areas.

In accordance with another embodiment of the present invention, at least one of the above-mentioned plurality of areas 16a to 16e (in this embodiment, for example, the area represented by the reference numeral 16b) is further divided into a plurality of very small areas.

Figure 5:
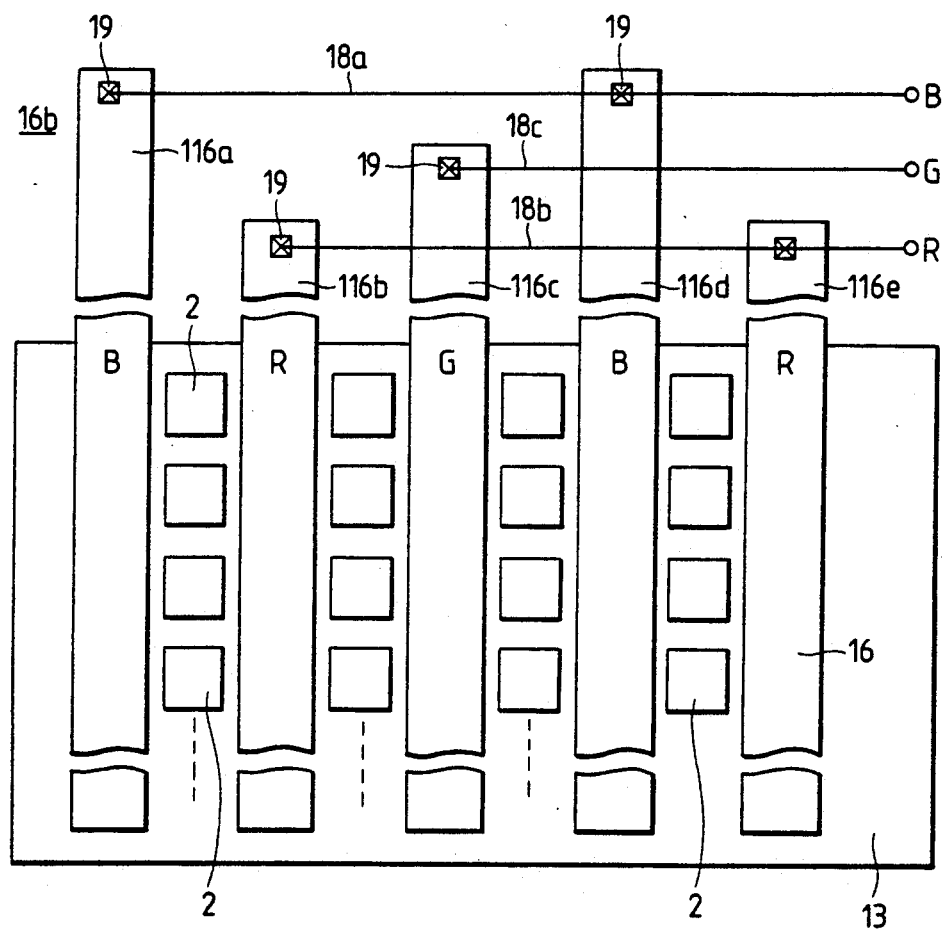
FIG. 5 is a plan view illustrating the shape of an upper transparent electrode layer arranged in accordance with another embodiment of the present invention.

FIG. 5 is an enlarged view of a partial area (16b) of the above-mentioned upper electrode layer 16.

The same constituent elements as those in FIG. 1 and 2 are represented by the same reference numerals and a further description of those elements will be omitted.

The upper electrode layer 16 disposed over the lower electrode 13 through the pn-junction photodiode is further divided into a plurality of strip-shaped very small areas 116a, 116b, 116c, . . ., and color filters in the three primary colors, designated by R, G, and B, are arrayed repeatedly on the very small areas. The upper electrode layers 16 on which the color filter of the same color are disposed are connected to a corresponding one of three output lines 18a, 18b and 18c through associated contact portions 19.

Further, a multiplexer may be connected to the respective output portions of the output lines to multiplex the outputs so as to extract the respective R, G and B color signals in time sequence. In this case, only one line, that is, only one output terminal, suffices for the output from the multiplexer, so that the chip size is not increased.

In the thus-arranged image sensor, while photoelectric conversion for photographing is performed by the light-detecting portions 2 provided in the same manner as in the conventional sensor, light incident to the other areas is photoelectrically converted by and extracted from a photometry sensor (constituted by the parts designated 13, 15 and 16 in FIG. 1) provided over the surface area of the substrate except the light-detecting portions 2. Further, the upper transparent electrode layer 16 is patterned into a plurality of areas, and a signal required for photometry is extracted selectively from the patterned areas. Moreover, since one area (16b) of the photometry sensor is divided into a plurality of very small areas on which filters for respective colors are disposed, signals of the same color can be extracted independently of the other colors so that a detection signal for automatic white balance can be obtained.

Although an interline CCD has been described by way of example in the above-mentioned embodiment, it is understood that, as in the previously described embodiment, the present invention is not limited to such a device, and any type of CCD sensor, for example, a frame transfer CCD, a MOS-type CCD, or the like, can be employed.

As has been described above, in the image sensor according to the present invention, in addition to a light-detecting portion used for detecting an image signal in the same manner as in a conventional sensor, a photometry sensor is provided in a an area on the same ship outside of the light-detecting portion to obtain a signal for photometry and a signal for white balance, whereby various photographing factors can be determined with no adverse effect on the photographing operations in an electronic still camera or the like in which this sensor is used. Further, photometry with a high accuracy and miniaturization of the photographing apparatus can be attained since the photometry sensor is incorporated on the same chip.

What is claimed is:

1. An image sensor comprising:
   a photographic sensor and a photometry sensor provided in overlapping arrangement on a same semiconductor chip area in order to provide both photographic and photometric sensor functions,
   said photographic sensor comprising a charge coupled device (CCD) composed of a plurality of light-detecting photoelectric elements disposed in a matrix and formed on a substrate, an insulating layer disposed over said substrate, and a light-shielding layer disposed over the surface of said insulating layer except over the areas of said light-detecting photoelectric elements; and
   said photometry sensor comprising:
   said light-shielding layer, wherein said light-shielding layer is composed of a conductive material and forming a lower electrode; a pn-junction photodiode layer disposed over said light-shielding layer except over the areas of said light-detecting photoelectric elements; and an upper transparent electrode layer disposed at least over said photodiode layer.

2. An image sensor comprising:
   a photographic sensor and a photometry sensor provided in overlapping arrangement on a same semiconductor chip area in order to provide both photographic and photometric sensor functions,
   said photographic sensor comprising a charge coupled device (CCD) composed of a plurality of light-detecting photoelectric elements disposed in a matrix and formed on a substrate, an insulating layer disposed over said substrate, and a light shielding layer disposed over the surface of said insulating layer except over the areas of the light-detecting photoelectric elements; and
   said photometry sensor comprising:
   said light shielding layer, wherein said light-shielding layer is composed of a conductive material and forming a lower electrode; a pn-junction photodiode layer disposed over said light-shielding layer except over the areas of said light-detecting photoelectric elements; an upper transparent electrode layer disposed at least over said photodiode layer and being divided into a plurality of pattern areas, at least one of said pattern areas of said upper transparent electrode layer being further divided into a plurality of smaller areas; color filters formed over said smaller areas; and electrode means coupled to said smaller areas for extracting color signals for each of said smaller areas, wherein said color signals for same colors can be extracted independently of said color signals for other colors.

3. The image sensor according to claim 1, wherein said upper transparent electrode layer is divided into a plurality of pattern areas.

4. The image sensor according to claim 3, wherein said plurality of pattern areas comprise a central round area and a plurality of generally rectangular area surrounding said central round area.

5. The image sensor according to claim 1, wherein said pn-junction photodiode layer comprises a a-Si pn junction.

6. The image sensor according to claim 1, wherein said pn-junction photodiode layer comprises a GaAs pn junction.

7. The image sensor according to claim 1, wherein said pn-junction photodiode layer comprises a GaP pn junction.

* * * * *